(12) United States Patent
Seefeldt et al.

(10) Patent No.: US 8,355,478 B1
(45) Date of Patent: Jan. 15, 2013

(54) CIRCUIT FOR ALIGNING CLOCK TO PARALLEL DATA

(75) Inventors: James Douglas Seefeldt, Eden Prairie, MN (US); Weston Roper, Shakopee, MN (US); James Hansen, Richfield, MN (US)

(73) Assignee: Honeywell International Inc., Morristown, NJ (US)

( * ) Notice: Subject to any disclaimer, the term of this patent is extended or adjusted under 35 U.S.C. 154(b) by 853 days.

(21) Appl. No.: 12/475,414

(22) Filed: May 29, 2009

(51) Int. Cl.
H04L 7/033 (2006.01)

(52) U.S. Cl. ......................................... 375/355; 375/373

(58) Field of Classification Search .................. 375/376, 375/373, 344, 375, 355; 327/156, 158, 161, 327/163; 370/518, 536; 331/12
See application file for complete search history.

(56) References Cited

U.S. PATENT DOCUMENTS

| | | | |
|---|---|---|---|
| 5,003,562 A | 3/1991 | van Driest et al. | |
| 5,056,118 A | 10/1991 | Sun | |
| 5,105,108 A | 4/1992 | Ngo | |
| 5,126,690 A | 6/1992 | Bui et al. | |
| 5,991,308 A | 11/1999 | Fuhrmann et al. | |
| 6,147,561 A * | 11/2000 | Rhee et al. | 331/12 |
| 6,150,891 A | 11/2000 | Welland et al. | |
| 6,311,050 B1 | 10/2001 | Welland et al. | |
| 6,426,662 B1 | 7/2002 | Arcus | |
| 6,549,765 B2 | 4/2003 | Welland et al. | |
| 6,577,691 B2 | 6/2003 | Richards et al. | |
| 6,853,252 B2 | 2/2005 | Dickmann | |
| 6,909,329 B2 | 6/2005 | Jasa et al. | |
| 6,950,485 B2 | 9/2005 | Richards et al. | |
| 7,054,403 B2 | 5/2006 | Nosaka et al. | |
| 7,069,458 B1 | 6/2006 | Sardi et al. | |
| 7,167,686 B2 | 1/2007 | See et al. | |
| 7,181,639 B2 | 2/2007 | Chua-Eoan et al. | |
| 7,218,157 B2 | 5/2007 | Van De Beek et al. | |
| 7,323,946 B2 | 1/2008 | Seefeldt et al. | |
| 2002/0056854 A1 | 5/2002 | Tang et al. | |
| 2002/0136342 A1 * | 9/2002 | Lee et al. | 375/376 |
| 2004/0263143 A1 * | 12/2004 | Lee | 323/312 |

(Continued)

FOREIGN PATENT DOCUMENTS

DE 100 10 947 A1 9/2001

(Continued)

OTHER PUBLICATIONS

European Search Report from corresponding EP Application No. 10163187.7, 3 pages, mailed Aug. 25, 2010.

(Continued)

*Primary Examiner* — Aristocratis Fotakis
(74) *Attorney, Agent, or Firm* — Shumaker & Sieffert, P.A.

(57) ABSTRACT

Method and system for aligning a clock signal to parallel data are described. According to one embodiment, a clock shifting circuit shifts an incoming clock signal relative to an incoming data signal, and a data clocking circuit uses the shifted clock signal to reclock the incoming data signal. The clock shifting circuit may comprise a phase locked loop (PLL) coupled with multiple D flip flops (DFFs) connected in series. Divisional combinatorial logic may be disposed between DFFs in the series. Data clocking circuits may comprise one DFF to reclock each incoming data bit, a pair of DFFs to reclock each incoming data bit, or other circuits such as true-complement blocks to serve as local oscillators to mixers. Multiple shifted clock signals may be produced, such as those shifted 60, 90, 120, 180, 240, and 270 degrees relative to the incoming clock signal.

20 Claims, 5 Drawing Sheets

U.S. PATENT DOCUMENTS

| | | | | |
|---|---|---|---|---|
| 2005/0135527 | A1* | 6/2005 | Masui et al. | 375/355 |
| 2006/0284657 | A1* | 12/2006 | Park et al. | 327/156 |
| 2008/0246522 | A1* | 10/2008 | Kossel et al. | 327/159 |
| 2009/0219067 | A1* | 9/2009 | Kizer | 327/156 |

FOREIGN PATENT DOCUMENTS

| | | |
|---|---|---|
| DE | 10 2006 028 966 A1 | 2/2007 |
| EP | 0 326 856 A1 | 8/1989 |
| WO | WO9527330 A1 | 10/1995 |
| WO | WO2004088845 A1 | 10/2004 |

OTHER PUBLICATIONS

European Examination Report from corresponding EP Application No. 10163187.7, 5 pages, mailed Sep. 7, 2010.

Reply to communication from the Examining Division, for EP Application No. 10163187.7, dated Dec. 10, 2010, 51 pages.

Summons to Attend Oral Proceedings for EP Application No. 10163187.7, dated Apr. 7, 2011, 7 pages.

Response to Summons for EP Application No. 10163187.7, dated Jun. 2, 2011, 17 pages.

Brief Communication for EP Application No. 10163187.7, dated Jun. 16, 2011, 4 pages.

Response to Communication dated Jun. 16, 2010 for EP Application No. 10163187.7, dated Jun. 2, 2011, 16 pages.

Decision from Examining Division for EP Application No. 10163187.7, dated Jul. 15, 2011, 13 pages.

Moreira et al., "A 1.25Gbitis Serializer for LHC Data and Trigger Optical Links," Proceedings of the Fifth Workshop on Electronics for LHC Experiments, Snowmass, Colorado, USA, CERN 99-09, pp. 194-198, http://ph-collectif-lecc-workshops.web.cern.ch/ph-collectif-lecc-workshops/Ie99_book/opto/moreira.pdf.

Communication dated Jul. 15, 2011, for corresponding EP Application No. 10 163 187.7, 20 pages.

* cited by examiner

CIRCUIT FOR ALIGNING CLOCK TO PARALLEL DATA

BACKGROUND

When parallel data are sent between locations in digital systems, the associated clock signal is typically sent on a separate path. When both the data and clock signals arrive at the receiving location, the rising edge of the clock signal may be coincident with the rising edge of the data signals. It may be difficult to process the data signals at the receiving location with coincident rising edges. To overcome this difficulty, the data may be retimed by shifting the phase of the clock relative to the phase of the data.

Delay locked loops may be used to retime clock signals. However, delay locked loops may not be available in all development libraries. Additionally, delay locked loops may have high power consumption and constrictive operating parameters such as temperature range. A delay locked loop retiming circuit may also introduce jitter into the clock signal.

SUMMARY

In one embodiment of the present invention, a system for aligning clock and data signals is disclosed. The system is divided into a clock shifting circuit and a data clocking circuit. The clock shifting circuit receives an incoming clock signal and outputs a shifted clock signal. The data clocking circuit receives a plurality of incoming data bits and receives, from the clock shifting circuit, the shifted clock signal and outputs reclocked data bits. The clock shifting circuit comprises a phase locked loop (PLL) with a reference input, a feedback input, and a PLL output and a plurality of n D flip flops connected in series. The incoming clock signal is connected to the reference input of the PLL. For the plurality of n D flip flops connected in series, each D flip flop has a D input, a clock input, a Q output, and a Q-bar output. The PLL output is connected to the clock input of every D flip flop, and the Q output of a D flip flop is connected to the D input of a subsequent D flip flop in the series. The Q-bar output of the last D flip flop in the series is connected to the D input of the first D flip flop in the series. The Q-bar output of the last D flip flop in the series is also buffered and connected to the feedback input of the PLL.

In another embodiment, another system for aligning clock and data signals comprising a clock shifting circuit and a data clocking circuit is disclosed. The clock shifting circuit receives an incoming clock signal and generates as output a first shifted clock signal and a second shifted clock signal. The data clocking circuit receives the first and second shifted clock signals and a plurality of incoming data bits, and it outputs a plurality of reclocked data bits. The clock shifting circuit comprises a phase locked loop (PLL) with a reference input, a feedback input, and a PLL output; a first D flip flop having a first D input, a first clock input, a first Q output, and a first Q-bar output; a divisional combinatorial logic block; and a second D flip flop having a second D input, a second clock input, a second Q output, and a second Q-bar output. The incoming clock signal is connected to the reference input.

In this embodiment, the PLL output is connected to the first clock input of the first D flip flop, and the first Q output of the first D flip flop is the first shifted clock signal. The divisional combinatorial logic block receives at least one input from the first D flip flop and generates at least one output. The PLL output is also connected to the second clock input of the second D flip flop, and the output of the divisional combinatorial logic block is connected to the second D input of the second D flip flop. The second Q-bar output is connected to the first D input. Additionally, the second Q-bar output of the second D flip flop is buffered and connected to the feedback input of the PLL, and the second Q-bar output is also the second shifted clock signal.

Further embodiments include various configurations of a data clocking circuit. For example, the data clocking circuit may be a plurality of D flip flops, each having a D input, a clock input, and a Q output, such that each incoming data bit is connected to the D input of one D flip flop. The shifted clock signal is connected to the clock input of all of the plurality of D flip flops, and the Q outputs of the plurality of D flip flops are the reclocked data bits. Alternately, the data clocking circuit may comprise a plurality of D flip flops pairs, each pair comprising two D flip flops, each D flip flop having a D input, a clock input, and a Q output. In this configuration, each incoming data bit is connected to both D inputs of one D flip flop pair, and one of the pair of clock inputs is connected to the shifted clock signal while the other of the pair of clock inputs is connected to an inverted shifted clock signal. The pair of Q outputs together constitute a single reclocked data bit. Other data clocking circuit configurations may involve true-complement blocks to create a variety and multiplicity of phase-shifted clock signals.

In yet another embodiment, a method of aligning clock and data signals is disclosed. An incoming clock signal at a first frequency is received at a PLL. A modified clock signal at a second frequency is generated using the PLL. The PLL also receives a feedback Q signal at a feedback input and multiplies the incoming clock signal so that the second frequency is greater than the first frequency. The modified clock signal is then received at a first clock input of a first D flip flop; the first D flip flop also receives a feedback Q signal at a first D input. A shifted clock signal, at a third frequency, is generated using the first D flip flop. The third frequency is less than the second frequency, and the shifted clock signal is phase-shifted relative to the incoming clock signal. The shifted clock signal is transmitted to a second D input at a second D flip flop. The modified clock signal is received at a second clock input of a second D flip flop. The feedback Q signal is generated at a second Q-bar output of the second D flip flop. The shifted clock signal is applied to logic circuitry to which an incoming data signal is applied. In alternate embodiments of this method, the shifted clock signal may pass through additional circuitry, such as additional D flip flops connected in series, before reaching the second D flip flop.

DETAILED DESCRIPTION OF THE DRAWINGS

A phase locked loop (PLL) is a circuit component that receives as input a reference signal and a feedback signal. The PLL generates an output signal that is in phase with the input signals, but the output frequency may be different from the input frequencies. For example, the phase locked loop may multiply the frequencies of the input signal to create a higher frequency output signal. The difference between the input frequencies and the output frequency may be by a factor of a fixed multiplier. The output signal is eventually fed back into the phase locked loop via the feedback signal input to create a negative feedback loop that ensures the equivalence of the phases of the reference signal and the output signal. PLLs may be implemented using either analog or digital circuit components. Relative to a delay locked loop, a PLL may have lower power consumption, more robust operation, more stability, less jitter, and more reliability. For the purposes of the discussion below, the preferred implementation of a PLL is an analog implementation, but any suitable PLL or equivalent circuit may be used in the context of the invention.

A D flip flop (DFF) is a digital circuit component that acts as two latches in series. A DFF receives a data signal at a D input and a clock signal at a clock input. On the rising edge of the clock signal, the DFF transfers the value from the D input to a Q output. The Q output will hold that transferred value until the next rising edge of the clock, at which time a new value is transferred from the D input to the Q output. Typically, DFFs also have a not-Q output—also called a "Q-bar" or "QB" output—that, at any given time, carries the inverse of the Q output value. DFFs may be configured with external connections to operate as dividers. The delay through a flip flop may also cause the output to be phase shifted relative to the clock.

Figure 1:
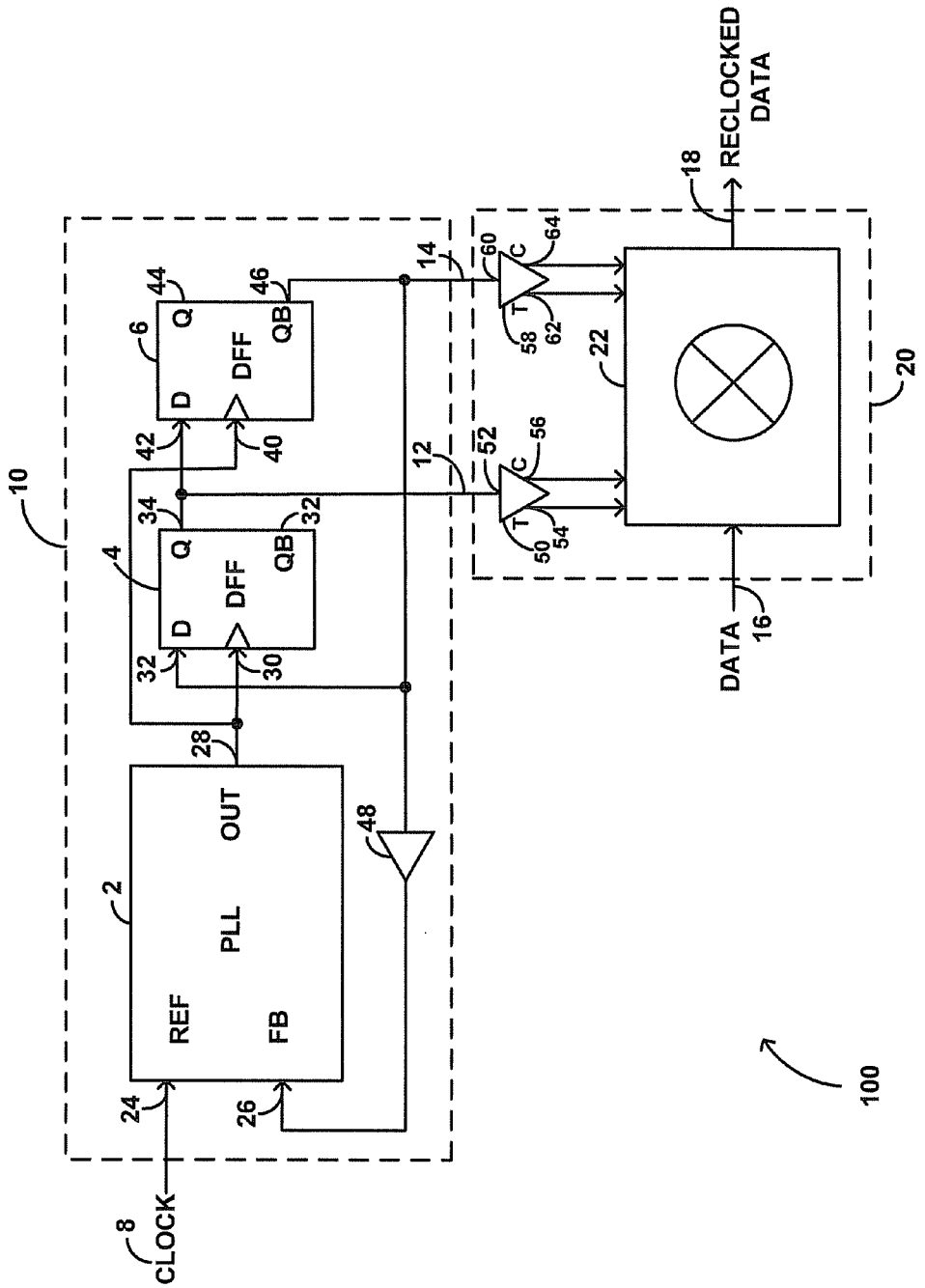
FIG. 1 is a block diagram of a circuit for generating a four-phase clock for use as a local oscillator for a four quadrant mixer, according to an embodiment of the invention.

FIG. 1 depicts system 100, a circuit for aligning clock to parallel data, according to an embodiment of the invention. System 100 comprises a clock shifting circuit 10 and a data clocking circuit 20. Clock shifting circuit 10 receives an incoming clock signal 8 and outputs a first shifted clock signal 12 and a second shifted clock signal 14. Data clocking circuit 20 receives first shifted clock signal 12 and second shifted clock signal 14 from clock shifting circuit 10 and a plurality of incoming data bits 16. Data clocking circuit 20 outputs a plurality of reclocked data bits 18.

Incoming clock signal 8 and the plurality of incoming data bits 16 may carry signals from distance places in a larger computing system. For example, incoming clock signal 8 and the plurality of incoming data bits 16 may be transmitted on data buses from a distant chip to the chip in which system 100 is laid out. Incoming clock signal 8 and the plurality of incoming data bits 16 may be synchronized upon arrival at system 100 so that their rising edges are coincident. Buffers may drive incoming clock 8 and the plurality of incoming data bits 16 into system 100.

Clock shifting circuit 10 comprises a PLL 2, a first DFF 4, a second DFF 6, and a buffer 48. PLL 2 has two inputs: a reference input 24 and a feedback input 26. PLL generates an output 28. Reference input 24 receives incoming clock signal 8. Feedback input 26 receives a signal fed back from DFF 6 to create a negative feedback loop. PLL 2 generates a modified clock signal by multiplying incoming clock signal 8 by a fixed multiplier. For example, the fixed multiplier may be four, and the modified clock signal may therefore have frequency four times greater than incoming clock signal 8. PLL 2 applies the modified clock signal to output 28 to be transmitted to other parts of clock shifting circuit 10.

DFF 4 has a clock input 30, a D input 32, a Q output 34, and a Q-bar output 36. DFF 4 may be implemented using any appropriate digital logic. Connected to output 28, clock input 30 receives the modified clock signal, which clocks DFF 4. Nothing is connected to Q-bar output 36. DFF 6 has a clock input 40, a D input 42, a Q output 44, and a Q-bar output 46. DFF 6 may be implemented using any appropriate digital logic. Connected to output 28, clock input 40 receives the modified clock signal, which clocks DFF 6. Q output 34 of DFF 4 is connected to D input 42 of DFF 6. Q-bar output 46 is fed back to D input 37 of DFF 4 and also to feedback input 26 of PLL 2, the latter through buffer 48. Nothing is connected to Q output 44. Buffer 48 may be matched to the signal delays through DFF 4 and DFF 6.

DFF 4 transfers fed back signal on D input 32 to Q output 34 on the rising edge of the modified clock signal. Thus, DFF 4 divides the frequency of the modified clock signal by two, and shifts the phase, to generate the first shifted clock signal 12. The first shifted clock signal 12 may be phase-shifted 90 degrees relative to incoming clock signal 8. Q-bar output of DFF 6 constitutes a second shifted clock signal 14, and second shifted clock signal 14 may be phase-shifted 360 degrees—the same as being shifted zero degrees—relative to incoming clock signal 8.

Data clocking circuit 20 comprises a first true-complement block 50, a second true-complement clock 58, and a four quadrant mixer 22. First true-complement block 50 has an input 52, a true output 54, and a complement output 56. True output 54 may be a signal having no phase shift relative to input 52. Complement output 56 may be a signal having a phase shift of 180 degrees relative to input 52. First true-complement block 50 may be implemented using gate logic or any other appropriate logic or circuit components.

First shifted clock signal 12 is connected to input 52 of first true-complement block 50. Given a 90 degree phase shift in first shifted clock signal 12, true output 54 carries an output signal phase-shifted 90 degrees relative to incoming clock signal 8, and complement output 56 carries another signal that is phase-shifted 270 degrees relative to incoming clock signal 8. Mixer 22 receives both true output 54 and complement output 56 as inputs.

Second true-complement block 58 has an input 60, a true output 62, and a complement output 64. True output 62 may be a signal having no phase shift relative to input 60. Complement output 64 may be a signal having a phase shift of 180 degrees relative to input 60. Second true-complement block 58 may be implemented using gate logic or any other appropriate logic or circuit components.

Buffer 48 may also be implemented as a true-complement block so as to match the delay through first true-complement block 50 and second true-complement block 58. In this embodiment, the true output of buffer 48 is connected to feedback input 26, and the complement output of buffer 48 is unused.

Second shifted clock signal 14 is connected to input 60 of second true-complement block 60. Given a zero degree phase shift in second shifted clock signal 14, true output 62 carries an output signal phase-shifted zero degrees relative to incoming clock signal 8, and complement output 64 carries another signal phase-shifted 180 degrees relative to incoming clock signal 8. Mixer 22 receives both true output 62 and complement output 64 as inputs.

The four outputs from the first and second true-complement blocks together may constitute a local oscillator used to drive four quadrant mixer 22. Mixer 22 also receives the plurality of incoming data bits 16 and outputs the plurality of reclocked data bits 18. For this embodiment, the plurality of incoming data bits 16 may be a modulated signal, and mixer 22 may use the local oscillator input to downconvert the modulated signal and output the downconverted signal as reclocked data. In another embodiment, mixer 22 is replaced with a phase interpolator.

Figure 2:
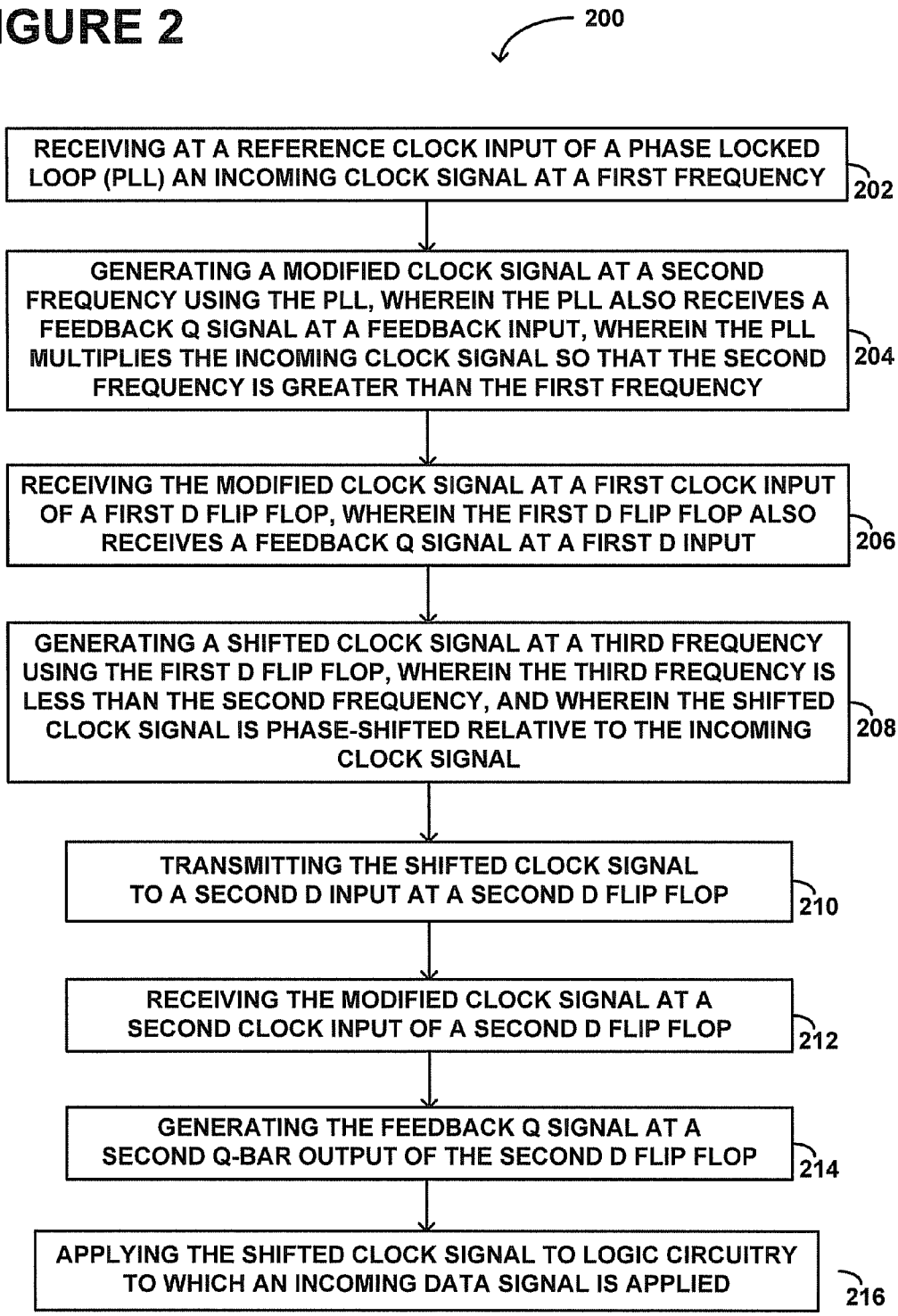
FIG. 2 is flow diagram of a method for aligning clock to parallel data, according to another embodiment of the invention.

FIG. 2 is flow diagram of an exemplary method 200 for aligning clock to parallel data, according to another embodiment of the invention. For illustrative purposes, method 200 may be performed using system 100, but may also be performed in any other appropriate system. The steps in method 200 may be changed, combined, subdivided, reordered, or otherwise permuted as appropriate or necessary and still fall within the scope and spirit of the invention.

At step 202, a reference clock input of a PLL received an incoming clock signal at a first frequency. The PLL is used at step 204 to generate a modified clock signal at a second frequency. The PLL also received a feedback signal Q at a feedback input. To generate the modified clock signal, the PLL multiplies the incoming clock signal so that the second frequency is greater than the first frequency. The PLL may multiply the incoming clock signal by a fixed multiplier.

A first clock input of a first DFF receives the modified clock signal at step 206. The first DFF also receives a feedback Q signal at a first D input. At step 208, the first DFF generates a shifted clock signal at a third frequency. The third frequency is less than the second frequency, and the shifted clock signal is phase-shifted relative to the incoming clock signal. The third frequency and the first frequency may be equal, and the phase shift of the shifted clock signal may be 90 degrees.

At step 210, the shifted clock signal is transmitted to a second D input at a second DFF. At step 212, a second clock input of the second DFF receives the modified clock signal. The second DFF generates the feedback Q signal at second Q-bar output of the second DFF at step 214. The shifted clock signal is applied to logic circuitry to which an incoming data signal is applied at step 216. The logic circuitry may be any appropriate data clocking circuit.

Figure 3:
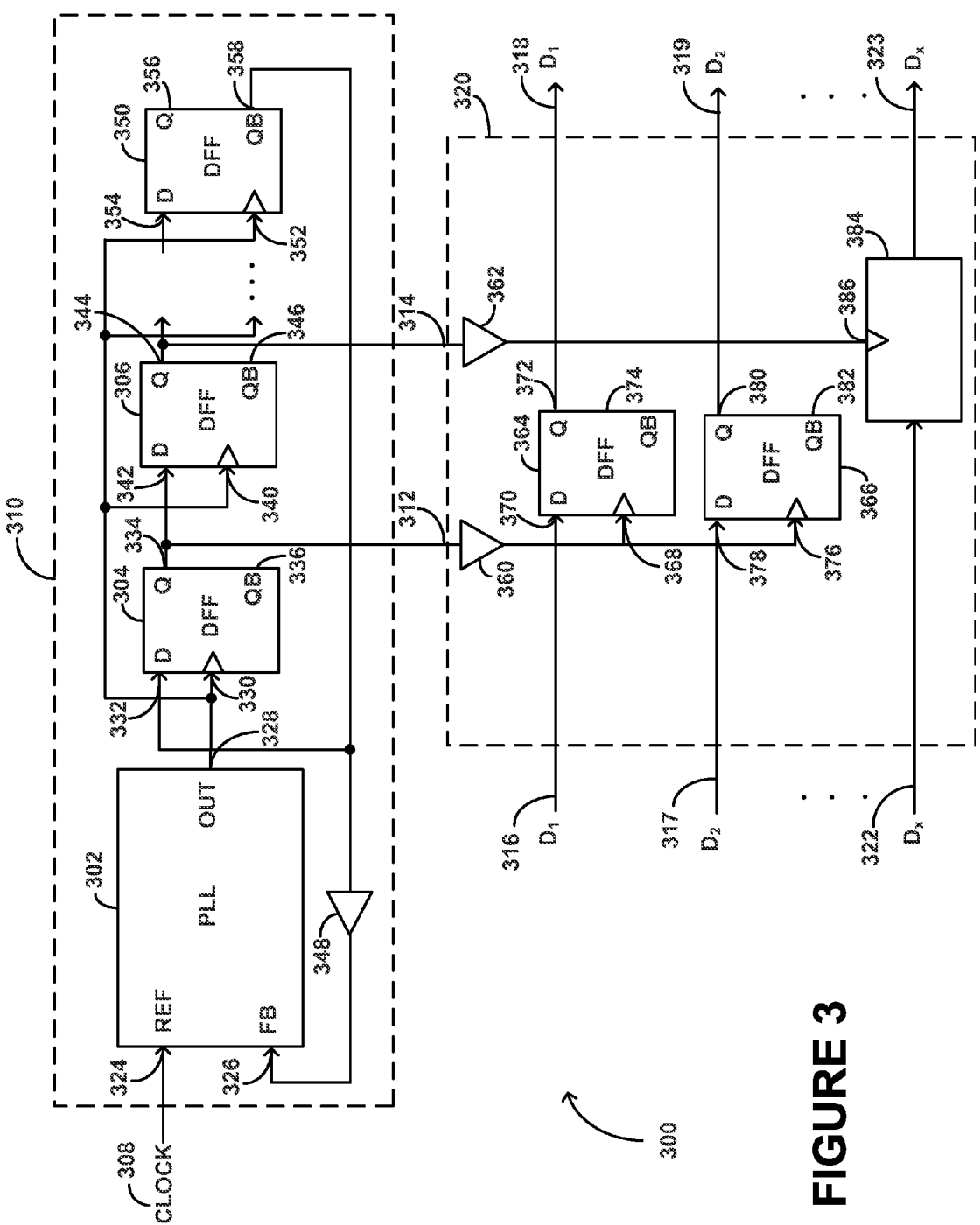
FIG. 3 is a block diagram of a circuit for aligning clock to parallel data, according to yet another embodiment of the invention.

FIG. 3 depicts system 300, a circuit for aligning clock to parallel data, according to yet another embodiment of the invention. System 300 comprises a clock shifting circuit 310 and a data clocking circuit 320. Clock shifting circuit 310 receives an incoming clock signal 308 and outputs a first shifted clock signal 312 and a second shifted clock signal 314. Data clocking circuit 320 receives first shifted clock signal 312 and second shifted clock signal 314 from clock shifting circuit 310 and incoming data bits 316, 317, and 319. Data clocking circuit 320 outputs reclocked data bits 318, 319, and 323.

Incoming clock signal 308 and incoming data bits 316 may carry signals from distant places in a larger computing system. For example, incoming clock signal 308 and incoming data bits 316 may be transmitted on data buses from a distant chip to the chip in which system 300 is laid out. Incoming clock signal 308 and incoming data bits 316 may be, at the time of their arrival at system 300, synchronized so that their rising edges are coincident. Buffers may drive incoming clock 308 and incoming data bits 316 into system 300.

Clock shifting circuit 310 comprises a PLL 302; a plurality of DFFs, of which a first DFF 304, a second DFF 306, and a last DFF 350 are shown; and a buffer 348. PLL 302 has two inputs: a reference input 324 and a feedback input 326. PLL 302 generates an output 328. Reference input 324 receives incoming clock signal 308. Feedback input 326 receives a signal fed back from last DFF 350 to create a negative feedback loop. PLL 302 generates a modified clock signal by multiplying incoming clock signal 308 by a fixed multiplier. For example, the fixed multiplier may be four, and the modified clock signal may therefore have frequency four times greater than incoming clock signal 308. PLL 302 applies the modified clock signal to output 328 to be transmitted to other parts of clock shifting circuit 310.

First DFF 304 has a clock input 330, a D input 332, a Q output 334, and a Q-bar output 336. First DFF 304 may be implemented using any appropriate digital logic. Connected to output 328, clock input 330 receives the modified clock signal, which clocks DFF 304. Nothing is connected to Q-bar output 336. Second DFF 306 has a clock input 340, a D input 342, a Q output 344, and a Q-bar output 346. Second DFF 306 may be implemented using any appropriate digital logic. Connected to output 328, clock input 340 receives the modified clock signal, which clocks DFF 306. Q output 334 of DFF 304 is connected to D input 342 of DFF 306. More DFFs may be connected in series after DFF 306. Each DFF has a clock input clocked using the modified clock signal, a D input that receives the Q output of the previous DFF in the series, and a Q output that transmits to the D input of the next DFF in the series.

Last DFF 350 has a clock input 352, a D input 354, a Q output 356, and a Q-bar output 358. Last DFF 350 may be implemented using any appropriate digital logic. Connected to output 328, clock input 352 receives the modified clock signal, which clocks DFF 350. The Q output from the DFF immediately preceding DFF 350 in the series is connected to D input 354 of DFF 350. Q-bar output 358 is fed back to D input 332 of DFF 304 and also to feedback input 326 of PLL 302, the latter through buffer 348. Nothing is connected to Q output 356. Buffer 48 may be matched to the total signal delays through the series of DFFs.

First DFF 304 transfers fed back signal on D input 332 to Q output 334 on the rising edge of the modified clock signal. Thus, DFF 304 divides the frequency of the modified clock signal, and shifts the phase, to generate the first shifted clock signal 312. The first shifted clock signal 312 may be phase-shifted relative to incoming clock signal 308. Q output 344 of DFF 306 constitutes a second shifted clock signal 314, and second shifted clock signal 314 may be phase-shifted relative to incoming clock signal 308.

Clock shifting circuit 310 may generate as many or as few shifted clock signals as are needed by data clocking circuit 320. The phase shift of a given shifted clock signal may be $(360/2n)x$ degrees relative to incoming clock signal 308, where the given shifted clock signal is connected to the Q output of $DFF_x$, the xth DFF in the series of DFFs, and where the series of DFFs has n DFFs total. For example, if there were three DFFs in system 300 (Q output 344 of DFF 306 connected directly to D input 354 of DFF 350), the first shifted clock signal 312 would be phase shifted 60 degrees relative to incoming clock signal 308 ($(360/(2*3))*1$), and the second shifted clock signal 314 would be phase shifted 120 degrees relative to incoming clock signal 308 ($(360/(2*3))*2$).

Data clocking circuit 320 comprises buffers 360 and 362, a DFF 364, a DFF 366, and an exemplary data processing block 384. Data clocking circuit may contain other DFFs or other data processing blocks to accommodate more or different incoming data bits.

DFFs 364 and 366 represent bit-by-bit data DFFs. DFF 364 has a clock input 368, a D input 370, a Q output 372, and a Q-bar output 374. DFF 364 may be implemented using any appropriate digital logic. First shifted clock signal 312 is buffered at buffer 360 and connected to clock input 368, which clocks DFF 364. Nothing is connected to Q-bar output 374. Incoming data bit 316 is connected to D input 370. DFF 364 transfers incoming data bit 316 from D input 370 to Q output 372 on the rising edge of the buffered first shifted clock signal 312. Because the first shifted clock signal is shifted relative to incoming clock signal 308, and assuming that incoming clock signal 308 and incoming data bit 316 was synchronized at their arrival to system 300, DFF 364 will not have to process coincident rising edges on D input 370 and clock input 368. Such coincident rising edges may cause a breakdown in the logic of DFF 364. DFF 364 outputs reclocked data bit 318 to Q output 372.

Similarly, DFF 366 has a clock input 376, a D input 378, a Q output 380, and a Q-bar output 382. DFF 366 may be implemented using any appropriate digital logic. Buffered first shifted clock signal 312 is connected to clock input 376, which clocks DFF 366. Nothing is connected to Q-bar output 372. Incoming data bit 317 is connected to D input 378. DFF 366 transfers incoming data bit 317 from D input 378 to Q output 380 on the rising edge of the buffered first shifted clock signal 312. Again, because the first shifted clock signal is shifted relative to incoming clock signal 308, and assuming that incoming clock signal 308 and incoming data bit 316 was synchronized at their arrival to system 300, DFF 366 will not have to process coincident rising edges on D input 378 and clock input 376. Such coincident rising edges may cause a breakdown in the logic of DFF 366. DFF 366 outputs reclocked data bit 319 to Q output 380. A plurality of incoming data bits may be reclocked in bit-by-bit DFFs in the same fashion as DFFs 364 and 366 reclock data bits 316 and 317.

Second shifted clock signal 314 may be buffered at buffer 362 and utilized differently that first shifted clock signal 312 within data clocking circuit 320. Buffers 360 and 362 may be matched to each other.

For example, data processing block 384 may carry out any necessary data processing such a data storage, arithmetic operations, logical operations, shifting, or filtering. Data processing block 384 receives incoming data bit 322 and receives buffered second shifted clock signal 314 at a clock input 386. After performing data operations on incoming data bit 322, data processing block 384 outputs reclocked data bit 323.

Figure 4:
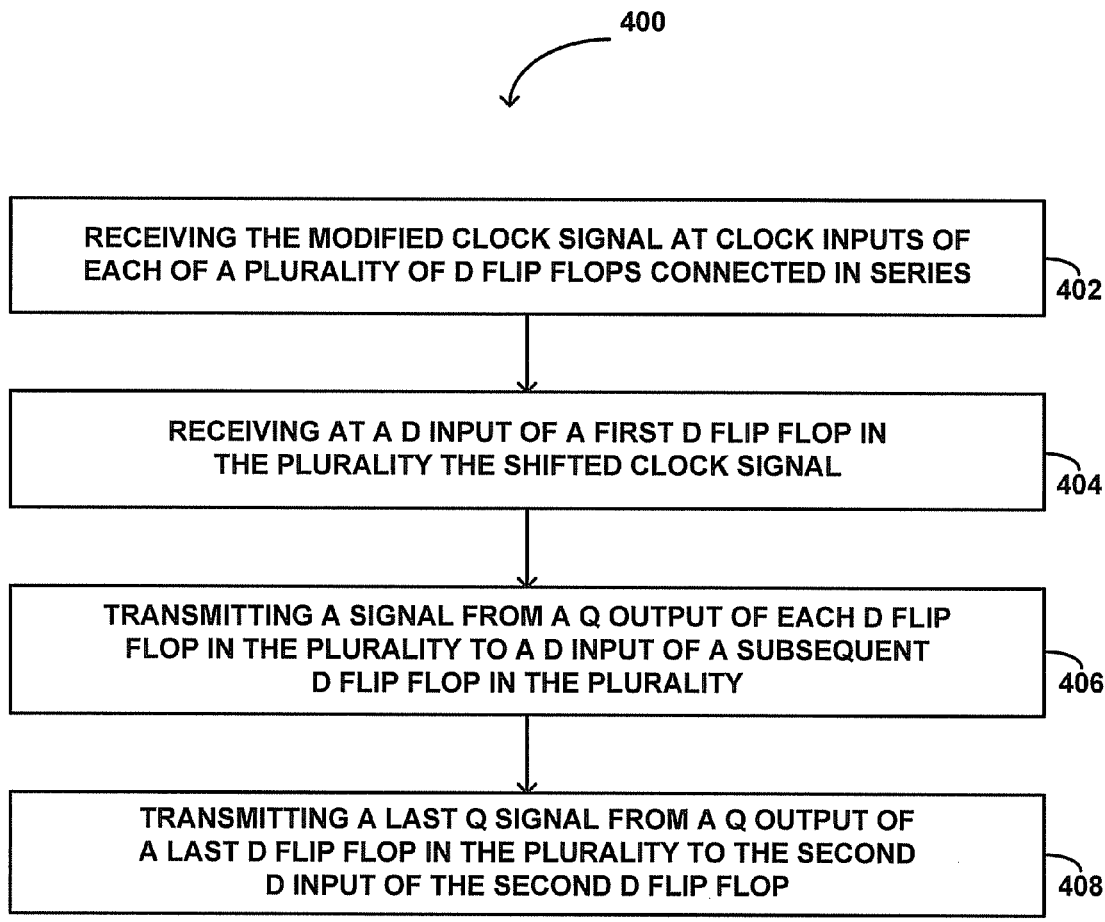
FIG. 4 is a flow diagram of a method for aligning clock to parallel data, according to yet another embodiment of the invention.

FIG. 4 is a flow diagram of a method 400 for aligning clock to parallel data, according to yet another embodiment of the invention. Method 400 is an alternate embodiment of the "transmitting the shifted clock signal to a second input at a second DFF" step 210 of method 200. Method 400 may be performed using system 300, more specifically clock shifting circuit 310, or using any other appropriate system. The steps in method 400 may be changed, combined, subdivided, reordered, or otherwise permuted as appropriate or necessary and still fall within the scope and spirit of the invention.

Method 400 details the transmission of signals through a plurality of DFFs connected in series in a clock shifting circuit. The plurality of DFFs referred to in method 400 would be disposed between the first and second DFFs described in method 200. At step 402, the clock input of each DFF in the plurality receives the modified clock signal to clock that DFF. A first DFF in the plurality receives the shifted clock signal (from the first DFF of method 200) at a D input at step 404. At step 406, each DFF in the plurality transmits a signal from its Q output to the D input of the next DFF in the plurality. This next DFF may be referred to as a subsequent DFF. The last DFF in the plurality, at step 408, transmits a last Q signal from its Q output to the second D input of the second DFF of method 200.

Figure 5:
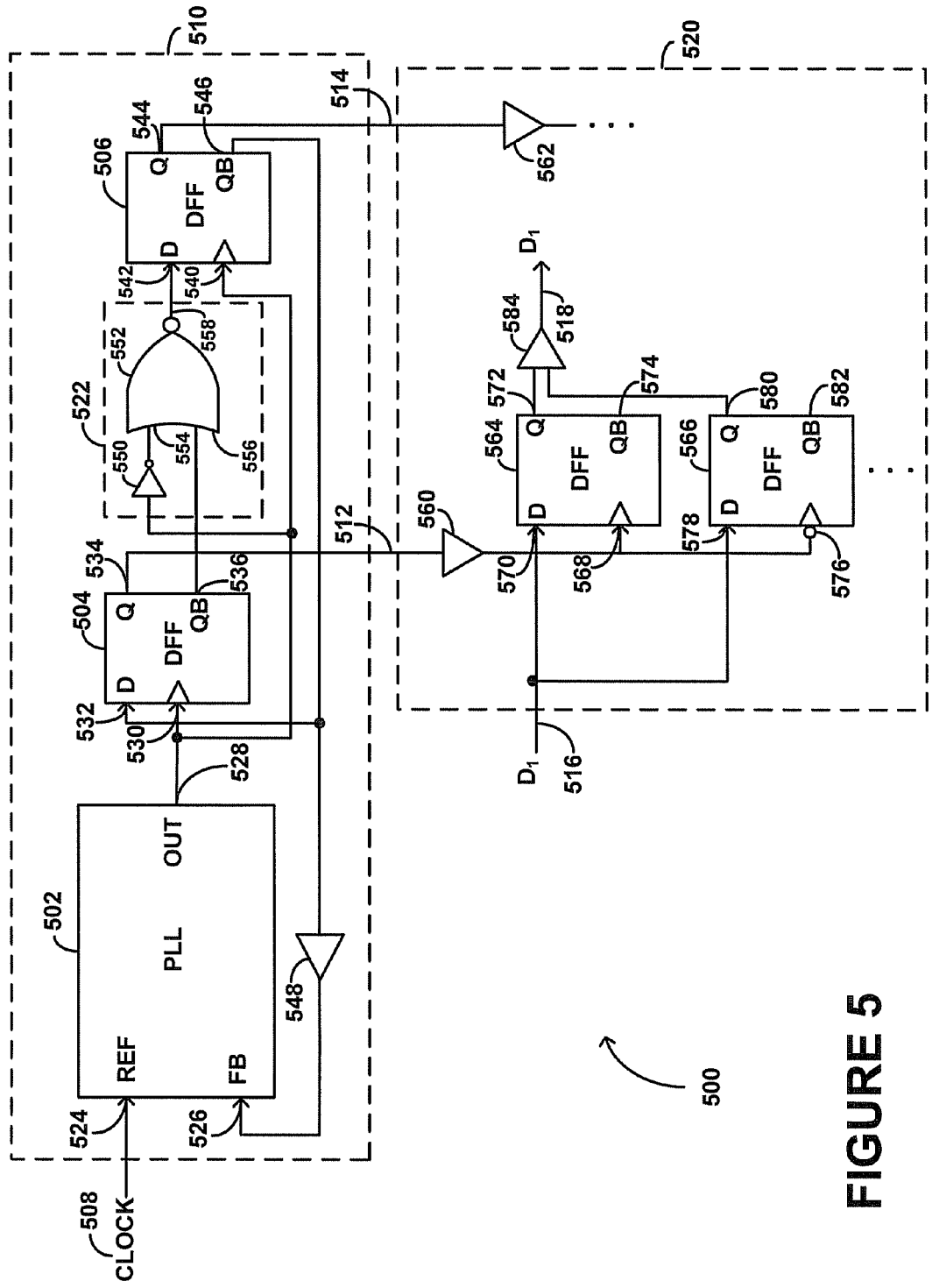
FIG. 5 is a block diagram of a circuit for aligning clock to parallel data, according to yet another embodiment of the invention.

FIG. 5 depicts system 500, a circuit for aligning clock to parallel data, according to yet another embodiment of the invention. System 500 comprises a clock shifting circuit 510 and a data clocking circuit 520. Clock shifting circuit 510 receives an incoming clock signal 508 and outputs a first shifted clock signal 512 and a second shifted clock signal 514. Data clocking circuit 520 receives first shifted clock signal 512 and second shifted clock signal 514 from clock shifting circuit 510 and an exemplary incoming data bit 516. Data clocking circuit 520 outputs an exemplary reclocked data bit 518.

Incoming clock signal 508 and exemplary incoming data bit 516 may carry signals from distance places in a larger computing system. For example, incoming clock signal 508 and exemplary incoming data bit 516 may be transmitted on data buses from a distant chip to the chip in which system 500 is laid out. Incoming clock signal 508 and exemplary incoming data bit 516 may be, at the time of their arrival at system 500, synchronized so that their rising edges are coincident. Buffers may drive incoming clock 508 and incoming data bit 516 into system 500.

Clock shifting circuit 510 comprises a PLL 502, a first DFF 504, a divisional combinatorial logic block 522, a second DFF 506, and a buffer 548. PLL 502 has two inputs: a reference input 524 and a feedback input 526. PLL 502 generates an output 528. Reference input 524 receives incoming clock signal 508. Feedback input 526 receives a signal fed back from second DFF 506 to create a negative feedback loop. PLL 502 generates a modified clock signal by multiplying incoming clock signal 508 by a fixed multiplier. For example, the fixed multiplier may be four, and the modified clock signal may therefore have frequency four times greater than incoming clock signal 508. PLL 502 applies the modified clock signal to output 528 to be transmitted to other parts of clock shifting circuit 510.

First DFF 504 has a clock input 530, a D input 532, a Q output 534, and a Q-bar output 536. First DFF 504 may be implemented using any appropriate digital logic. Connected to output 528, clock input 530 receives the modified clock signal, which clocks DFF 504.

Divisional combinatorial logic block 522 is disposed between DFF 504 and DFF 506 in the clock shifting circuit 510. Divisional combinatorial logic block 522 receives inputs from DFF 504 and PLL 502 and generates at least one output to DFF 506.

Second DFF 506 has a clock input 540, a D input 542, a Q output 544, and a Q-bar output 546. Second DFF 506 may be implemented using any appropriate digital logic. Connected to output 528, clock input 540 receives the modified clock signal, which clocks DFF 506. Q-bar output 546 is fed back to D input 532 of DFF 504 and also to feedback input 526 of PLL 502, the latter through buffer 548. Buffer 548 may be matched to the total signal delays through DFF 504, divisional combinatorial logic block 522, and DFF 506.

First DFF 504 transfers the fed back signal on D input 532 to Q output 534 on the rising edge of the modified clock signal. Thus, DFF 504 divides the frequency of the modified clock signal, and shifts the phase, to generate the first shifted clock signal 512. The first shifted clock signal 512 may be phase-shifted relative to incoming clock signal 508.

Divisional combinatorial logic block 522 may comprise any signal division or other appropriate logical operation. Preferably, divisional combinatorial logic block 522 is implemented with single scale integration (SSI) logic gates. As shown in FIG. 5, divisional combinatorial block 522 may be a divide-by-three circuit implemented by inverter 550 and NOR gate 552. NOR gate 552 performs a not-or logical operation on two inputs 554 and 556 to produce output 558. Inverter 550 applies an inverse of the modified clock signal to input 554 of NOR gate 552. Q-bar output 536 of DFF 504 connects to input 556 of NOR gate 552. Output 558 of NOR gate 552 connects to D input 542 of DFF 506. With a divide-by-three circuit in divisional combinatorial logic block 522, the first shifted clock signal 512 is phase-shifted 120 degrees relative to incoming clock signal 508.

Second DFF 506 transfers the NOR gate output 558 on D input 542 to Q output 544 on the rising edge of the modified clock signal. Thus, DFF 506 divides the frequency of the modified clock signal, and shifts the phase, to generate the second shifted clock signal 514. The second shifted clock signal 514 may be phase-shifted relative to incoming clock signal 508. With a divide-by-three circuit in divisional combinatorial logic block 522, the second shifted clock signal 514 is phase-shifted 240 degrees relative to incoming clock signal 508.

Clock shifting circuit 510 may generate as many or as few shifted clock signals as are needed by data clocking circuit 520. The portion of data clocking circuit 520 shown in FIG. 5 comprises a buffer 560 and a pair of DFFs, DFF 564 and DFF 566, and a buffer 584, to operate on exemplary incoming data bit 516 to produce reclocked data bit 518. Second shifted clock signal 514 may be buffered at buffer 562 and used by portions of the data clocking circuit not shown in FIG. 5.

DFF 564 has a clock input 568, a D input 570, a Q output 572, and a Q-bar output 574. DFF 564 may be implemented using any appropriate digital logic. First shifted clock signal 512 is buffered at buffer 560 and connected to clock input 568, which clocks DFF 564. Nothing is connected to Q-bar output 574. Exemplary incoming data bit 516 is connected to D input 570. DFF 564 transfers incoming data bit 516 from D input 570 to Q output 572 on the rising edge of the buffered first shifted clock signal 512. Because the first shifted clock signal is shifted relative to incoming clock signal 508, and assuming that incoming clock signal 508 and incoming data bit 516 was synchronized at their arrival to system 500, DFF 564 will not have to process coincident rising edges on D input 570 and clock input 568. Such coincident rising edges may cause a breakdown in the logic of DFF 564. DFF 564 outputs to Q output 572, which is connected to one input of buffer 584.

Similarly, DFF 566 has a clock input 576, a D input 578, a Q output 580, and a Q-bar output 582. DFF 566 may be implemented using any appropriate digital logic. Buffered first shifted clock signal 512 is connected to clock input 576, which is inverted to clock DFF 566. Nothing is connected to Q-bar output 582. Exemplary incoming data bit 516 is connected to D input 578. DFF 566 transfers exemplary incoming data bit 516 from D input 578 to Q output 580 on the falling edge of the buffered first shifted clock signal 512 due to the inverter at clock input 576. Again, because the first shifted clock signal is shifted relative to incoming clock signal 508, and assuming that incoming clock signal 508 and exemplary incoming data bit 516 was synchronized at their arrival to system 500, DFF 566 will not have to process coincident rising edges on D input 578 and clock input 576. Such coincident rising edges may cause a breakdown in the logic of DFF 566. DFF 566 outputs to Q output 580. Q output 580 is connected to a second input of buffer 584. Buffer 584 takes as input Q output 572 and Q output 580 and matches the delay through buffer 560 to generate exemplary reclocked data bit 518. A plurality of incoming data bits may be reclocked in bit-by-bit by DFF pairs in the same fashion that DFF 564 and DFF 566 reclock exemplary incoming data bits 516.

It should be understood that this and other arrangements described herein are set forth for purposes of example only, and other arrangements and elements (e.g., machines, interfaces, functions, and orders of elements) can be added or used instead and some elements may be omitted altogether. In particular, different clock shifting circuits may be paired with different data clocking circuits, as the other functions of a chip or system may require. Further, as in most circuits, those skilled in the art will appreciate that many of the elements described herein are functional entities that may be implemented as discrete components or in conjunction with other components, in any suitable combination and location.

What is claimed is:

1. A system for aligning clock and data signals comprising:
    a clock shifting circuit, receiving an incoming clock signal and outputting a shifted clock signal, comprising:
        a phase locked loop (PLL) with a reference input, a feedback input, and a PLL output, wherein the incoming clock signal connected to the reference input;
        a plurality of n D flip flops connected in series, each D flip flop having a D input, a clock input, a Q output, and a Q-bar output, wherein the PLL output is connected to the clock input of every D flip flop, wherein the Q output of a D flip flop is connected to the D input of a subsequent D flip flop in the series, wherein the Q-bar output of a last D flip flop in the series is connected to the D input of a first D flip flop in the series, wherein the Q-bar output of the last D flip flop in the series is buffered and connected to the feedback input, where n is an integer; and
        wherein the shifted clock signal is at least one Q output from the series of D flip flops; and
    a data clocking circuit, receiving the shifted clock signal and a plurality of incoming data bits and outputting a plurality of reclocked data bits.

2. The system of claim 1, wherein the plurality of n D flip flops connected in series comprises $DFF_x$, wherein $DFF_x$ is the xth D flip flop in the series, where x is an integer, wherein the Q output of $DFF_x$ transmits the shifted clock signal, and wherein the shifted clock signal has a phase shift of $(360/2n)x$ degrees relative to the incoming clock signal.

3. The system of claim 1, wherein the data clocking circuit comprises:
    a true-complement block receiving the shifted clock signal and outputting a true output and a complement output, wherein the true output carries a clock signal that has a phase shift of $(360/2n)x$ degrees relative to the incoming clock signal, and the complement output carries a clock signal that has a phase shift of $(360/2n)x+180$ degrees relative to the incoming clock signal, where x is an integer.

4. The system of claim 1, wherein the data clocking circuit comprises:
    a plurality of D flip flops, each having a D input, a clock input, and a Q output, wherein each incoming data bit is connected to the D input of one D flip flop, wherein the shifted clock signal is connected to the clock input of all of the plurality of D flip flops, and wherein the Q outputs of the plurality of D flip flops are reclocked data bits.

5. The system of claim 1, wherein the data clocking circuit comprises:
    a plurality of D flip flops pairs, each pair comprising two D flip flops, each D flip flop having a D input, a clock input, and a Q output, wherein each incoming data bit is connected to both D inputs of one D flip flop pair, wherein one of the pair of clock inputs is connected to the shifted clock signal and one of the pair of clock inputs is connected to an inverted shifted clock signal, and wherein the pair of Q outputs together constitute a single reclocked data bit.

6. The system of claim 1, wherein the shifted clock signal has a phase shift of 90 degrees relative to the incoming clock signal.

7. The system of claim 1, wherein the buffering on the feedback input of the PLL is matched to a total delay through the plurality of D flip flops.

8. The system of claim 1, wherein n equals 2, wherein the shifted clock signal is the Q output of the first D flip flop, and further comprising:
a first true-complement block having a first input, a first true output, and a first complement output, wherein the shifted clock signal is connected to the first input; and
a second true-complement block having a second input, a second true output, and a second complement output, wherein the Q-bar output of the second D flip flop is connected to the second input, and
wherein the first true output carries a clock signal that has a phase shift of 90 degrees relative to the incoming clock signal, the first complement output carries a clock signal that has a phase shift of 270 degrees relative to the incoming clock signal, the second true output carries a clock signal that is not phase shifted relative to the incoming clock signal, and the second complement output carries a clock signal that is phase shifted 180 degrees relative to the incoming clock signal.

9. The system of claim 8, wherein the data clocking circuit further comprises a four-quadrant mixer that receives all of the incoming data bits, wherein all four of the outputs of the first and second true-complement blocks constitute a local oscillator that drives the four-quadrant mixer, and wherein the four-quadrant mixer is configured to downconvert a modulated signal.

10. A system for aligning clock and data signals comprising:
a clock shifting circuit, receiving an incoming clock signal and generating as output a first shifted clock signal and a second shifted clock signal, comprising:
a phase locked loop (PLL) with a reference input, a feedback input, and a PLL output, wherein the incoming clock signal is connected to the reference input;
a first D flip flop having a first D input, a first clock input, a first Q output, and a first Q-bar output, wherein the PLL output is connected to the first clock input, wherein the first Q output is the first shifted clock signal;
a divisional combinatorial logic block receiving at least one input from the first D flip flop and generating at least one output; and
a second D flip flop having a second D input, a second clock input, a second Q output, and a second Q-bar output, wherein the PLL output is connected to the second clock input, wherein the output of the divisional combinatorial logic block is connected to the second D input, wherein the second Q-bar output is connected to the first D input, wherein the second Q-bar output is buffered and connected to the feedback input, wherein the second Q-bar output is the second shifted clock signal; and
a data clocking circuit, receiving the first and second shifted clock signals and a plurality of incoming data bits and outputting a plurality of reclocked data bits.

11. The system of claim 10, wherein the divisional combinatorial logic block comprises a NOR gate, creating a NOR output from the logic operation of Not-OR (NOR) on the first Q-bar output and the output of an inverter connected to the PLL output.

12. The system of claim 10, wherein the first shifted clock signal has a phase shift of 120 degrees relative to the incoming clock signal and the second shifted clock signal has a phase shift of 240 degrees relative to the incoming clock signal.

13. The system of claim 10, wherein the first shifted clock signal has a phase shift of 120 degrees relative to the reclocked data bits and the second shifted clock signal has a phase shift of 240 degrees relative to the reclocked data bits.

14. The system of claim 10, wherein the data clocking circuit comprises:
a plurality of D flip flops, each having a D input, a clock input, and a Q output, wherein each incoming data bit is connected to the D input of one D flip flop, wherein the first shifted clock signal is connected to at least one of the clock inputs of the plurality of D flip flops, wherein the second shifted clock signal is connected to at least one of the clock inputs of the plurality of D flip flops, and wherein the Q outputs of the plurality of D flip flops are reclocked data bits.

15. The system of claim 10, wherein the data clocking circuit comprises:
a plurality of D flip flops pairs, each pair comprising two D flip flops, each D flip flop having a D input, a clock input, and a Q output, wherein each incoming data bit is connected to both D inputs of one D flip flop pair, wherein one of the pair of clock inputs is connected to one of the first and second shifted clock signals and one of the pair of clock inputs is connected to an inverse of the same shifted clock signal, and wherein the pair of Q outputs together constitute a single reclocked data bit.

16. The system of claim 10, wherein the first shifted clock signal is coupled to a first buffer, wherein the second shifted clock signal is coupled to a second buffer, and wherein the first buffer and the second buffer are matched.

17. A method of aligning clock and data signals, comprising:
receiving at a reference clock input of a phase locked loop (PLL) an incoming clock signal at a first frequency,
generating a modified clock signal at a second frequency using the PLL, wherein the PLL also receives feedback Q signal at a feedback input, wherein the PLL multiplies the incoming clock signal so that the second frequency is greater than the first frequency;
receiving the modified clock signal at a first clock input of a first D flip flop, wherein the first D flip flop also receives the feedback Q signal at a first D input;
generating a shifted clock signal at a third frequency using the first D flip flop, wherein the third frequency is less than the second frequency, and wherein the shifted clock signal is phase-shifted relative to the incoming clock signal;
transmitting the shifted clock signal to a second D input at a second D flip flop;
receiving the modified clock signal at a second clock input of a second D flip flop;
generating the feedback Q signal at a second Q-bar output of the second D flip flop; and
applying the shifted clock signal to logic circuitry to which an incoming data signal is applied.

18. The method of claim 17, wherein the first frequency and the third frequency are the same and wherein the shifted clock signal is phase shifted 90 degrees relative to the incoming clock signal.

19. The method of claim 17, wherein the logic circuitry comprises a plurality of D flip flops.

20. The method of claim 17, wherein transmitting the shifted clock signal to a second D input at a second D flip flop comprises:
receiving the modified clock signal at clock inputs of each of a plurality of D flip flops connected in series;

receiving at a D input of a first D flip flop in the plurality the shifted clock signal;

transmitting a signal from a Q output of each D flip flop in the plurality to a D input of a subsequent D flip flop in the plurality; and transmitting a last Q signal from a Q output of a last D flip flop in the plurality to the second D input of the second D flip flop.

\* \* \* \* \*